United States Patent [19]
Kornblit

[11] Patent Number: 5,385,022
[45] Date of Patent: Jan. 31, 1995

[54] APPARATUS AND METHOD FOR DEEP THERMOELECTRIC REFRIGERATION

[76] Inventor: Levy Kornblit, Hameshahrerim 27 Apt. 5, Beer-Sheva, Israel, 84299

[21] Appl. No.: 119,363

[22] Filed: Sep. 9, 1993

[51] Int. Cl.[6] .............................................. F25B 21/02
[52] U.S. Cl. ........................................ 62/3.2; 62/3.7; 62/335
[58] Field of Search ...................... 62/3.2, 3.3, 3.7, 335

[56] References Cited

U.S. PATENT DOCUMENTS

| 4,483,341 | 11/1984 | Witteles | 62/3.2 |
| 4,947,648 | 8/1990 | Harwell et al. | 62/3.2 |

FOREIGN PATENT DOCUMENTS

| 514171 | 5/1976 | U.S.S.R. | 62/3.2 |
| 556685 | 6/1978 | U.S.S.R. | 62/3.2 |
| 1174687A | 8/1985 | U.S.S.R. | 62/3.2 |

Primary Examiner—John M. Sollecito
Attorney, Agent, or Firm—C. Michael Gegenheimer

[57] ABSTRACT

A method which removes the limitations existing on the cooling capability of ordinary TE coolers provides for thermally connecting in parallel a hierarchy of central and auxiliary thermoelectric couples to provide deep cooling of the central thermoelectric couple to temperatures below 100 degrees Kelvin, and as low as 70 degrees Kelvin or lower. These basic deep TE cooling units may serve as constituent components for the construction of one-stage deep TE modules which are capable of relatively high pumping capacity at very low temperatures. The present invention makes deep TE cooling possible with existing thermoelectric materials, and existing high volume semiconductor manufacturing techniques can be adapted for production of the present invention, so that solid state deep TE cooling becomes available for a wide variety of applications, including deep cooling of solid state electronics.

36 Claims, 4 Drawing Sheets

APPARATUS AND METHOD FOR DEEP THERMOELECTRIC REFRIGERATION

BACKGROUND OF THE INVENTION

This invention relates generally to thermoelectric coolers and, in particular, to deep thermoelectric (TE) coolers. As used herein, the term, deep TE cooling, refers to Peltier cooling to temperatures below 100 degrees Kelvin (°K.) (for example, liquid nitrogen ($LN_2$) temperatures, which are 77° K. or lower).

It is well known in the art of thermoelectrics that the low coefficient of performance (COP) of TE coolers has long prevented TE cooling devices from achieving the region of deep cooling. In turn, low COPs are derived from the fact that even the best modern materials for TE cooling show a thermoelectric "figure of merit", ZT, reflecting desirable material properties for thermoelectric cooling, which does not exceed unity.

That is, the cooling capability of a standard TE couple is limited, due mainly to the Joule heat evolution within the bulk of the couple, and particularly due to that portion of the Joule heat flux which normally reaches the cold junction of the couple. Cooling in TE couples is further limited by the heat flux conducted from the hot junction to the cold junction. Thus, the net cooling $Q_o$ at the cold junction may be expressed as:

$$Q_o = I P_T - \tfrac{1}{2} I^2 R - K \Delta T \qquad \text{Eq. (1)}$$

where I is the current, $P_T$ is the Peltier coefficient, and I $P_T$ represents reversible Peltier cooling;

R is the resistance of the TE couple, and $\tfrac{1}{2} I^2 R$ represents the half of the irreversible Joule heating which goes to the cold junction;

K is the thermal conductivity of the TE couple, $\Delta T$ is the temperature difference between the second end and cold junction, and $K \Delta T$ represents the heat conduction to the cold junction.

Research efforts in the art of TE cooling over the past four decades have concentrated on the problem of improving and increasing the ZT of known TE materials, i.e. inventing new and better materials to reduce heat losses. However, the increase in ZT required to achieve deep cooling by conventional means is so significant that such a material is unlikely to be developed in the near future. The lowest temperature reached with a TE refrigerator has been at best 134° K., using eight stages in a multi-stage design, and under laboratory conditions. To date, no practical working models of deep TE coolers exist.

Meanwhile, the need exists for deep TE coolers to satisfy the needs for solid state cooling without cryogenic fluids in a broad range of applications, including night vision, advanced electronics, computers, high temperature superconductors, and other applications at cryogenic temperatures.

SUMMARY OF THE INVENTION

The present invention satisfies that need with an apparatus and method which uses existing materials having relatively small coefficients of performance (COP), and modest thermoelectric figures of merit (ZT in the range of 0.7–1.0) to achieve deep TE cooling. Compatible with known materials, the present invention, thus, removes the obstacle of new materials development which has heretofore blocked the achievement of deep TE cooling.

In accordance with the present invention, a limited local compensation of the irreversible heat evolution, primarily the Joule heat evolution, at a TE couple, drastically improves the ability of known TE materials to reach deep TE cooling. In the present invention, the cooling capability of auxiliary TE couples is applied to compensate within the bulk of a central TE couple the whole Joule heat flux ($\tfrac{1}{2} I^2 R$) which is directed toward its cold junction. The primary limitation on the cooling capability of the central TE couple is thereby removed, and opens the ability to provide a cooling mechanism limited only by the low temperature limitations of the materials. This limited, local removal or reduction of the limiting irreversible heat production, again primarily the Joule heat evolution, is produced with a structure using familiar and well-investigated TE cooling materials, such as those based upon the $Bi_2Te_3$-like and BiSb alloy systems. Such a structure, also referred to herein as a compensated deep TE cooling unit or deep cooling unit, is preferably constructed using single stage TE couples, and is thus referred to as a single stage or one stage deep cooling unit. While multi-stage structures are possible as elements of the deep cooling unit, multi-stage structures are not necessary.

The preferred, single stage structure of the present invention applies the cold junction of a first auxiliary TE couple to the legs of length $L_I$ of a central TE couple at a position between the cold and hot junctions. Generally the point of connection is between the cold junction and an intermediate position at which the Joule heat is a maximum, and the Joule heat flux is zero. Thus, when the point of connection is spaced towards the cold junction it extracts the detrimental half of Joule heat which is directed towards the cold junction. In a linear embodiment of a deep cooling unit, the point of connection, i.e. heat extraction, preferably is approximately 0.4 $L_I$ from the cold end of the central TE couple. To achieve the heat extraction the central TE couple and first auxiliary TE couple are interconnected thermally, but isolated electrically. In turn, a second auxiliary TE couple is applied in like manner to the first auxiliary TE couple, and a third auxiliary TE couple is further applied in like manner to the second. Although additional TE couples may be added, three auxiliary TE couples are sufficient, and are preferred where all TE couples are single stage TE couples.

Heat conduction which further limits cooling capability may be reduced by purely geometrical means (i.e. modifying the size, shape, or dimensions of the particular TE couple to reduce thermal conduction), or, by a compensation procedure similar to that used to remove Joule heat. Depending on the material chosen, and exact structure, these units can attain temperatures as low as $LN_2$-temperature (77° K.) or even lower (e.g. to approximately 56° K.).

These and further features and advantages of the present invention will become apparent from the drawings and detailed description which follow.

DETAILED DESCRIPTION OF THE PREFERRED EMBODIMENTS

Referring to FIGS. 1–4, in accordance with the present invention, a deep cooling unit 10 is provided by applying the cooling capability of auxiliary thermoelectric (TE) couples to compensate within the bulk of a central TE couple 12 the whole Joule heat flux which is directed toward its cold junction. This limited local compensation of the irreversible heat evolution, primarily the Joule heat evolution, at the central TE couple 12 removes the primary limitation on the cooling capability of the central TE couple, enabling known TE materials to reach deep TE cooling.

In FIGS. 1–4 representative embodiments of apparatuses and methods for deep cooling in accordance with the present invention show compensated TE deep cooling units 10 which are scheduled for a minimum temperature of 70 degrees Kelvin (°K.) at the central TE couple without thermal load. As used herein, the term, deep TE cooling, refers to Peltier cooling to temperatures below 100° K. (for example, liquid nitrogen (LN$_2$) temperatures, which are 77° K. or lower). Short of such deep cooling, the present invention is able to achieve cooling below the limits (approximately 134° K.) of currently available technology.

Figure 1:
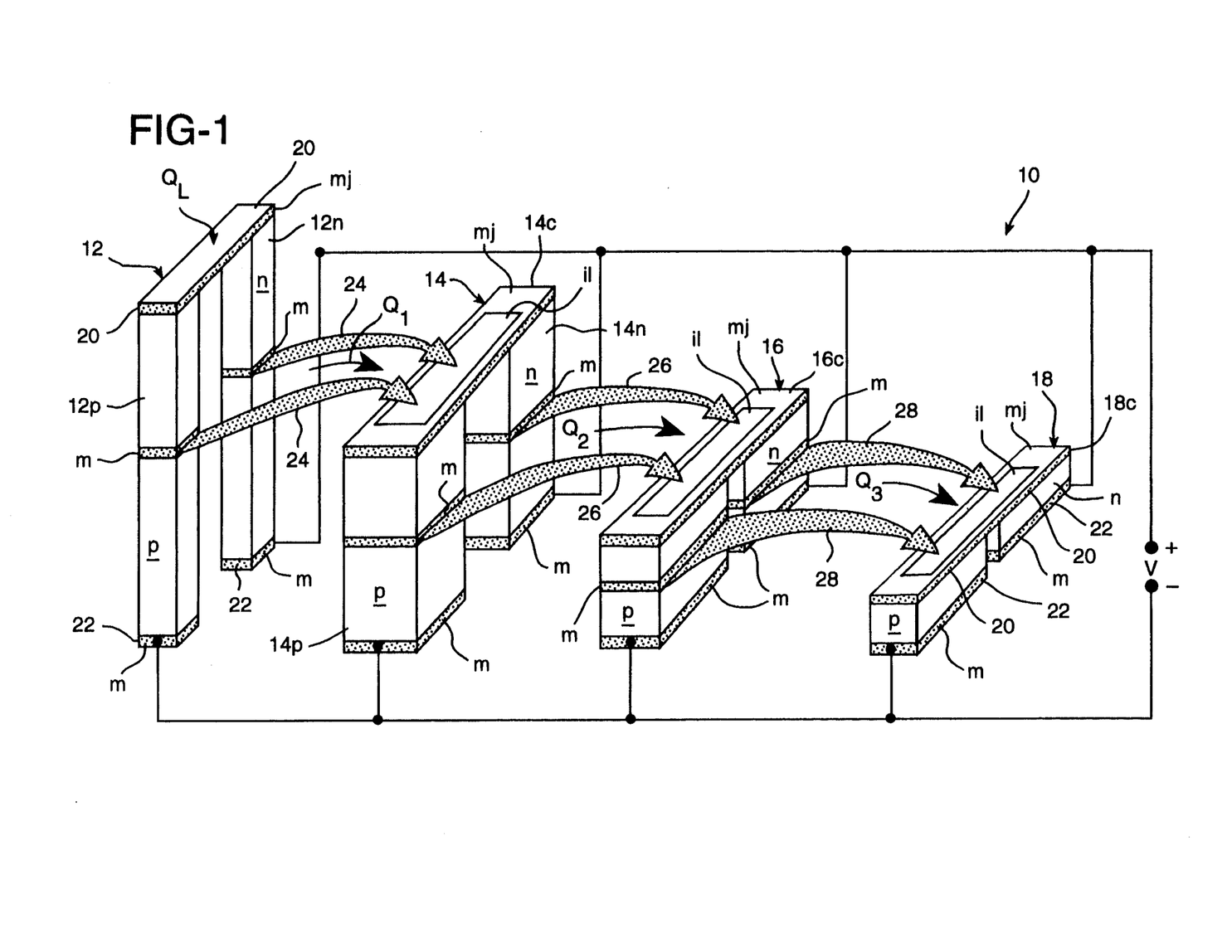
FIG. 1 shows a schematic perspective view of a compensated deep TE cooling unit.

Referring to preferred embodiment of FIG. 1, the compensated deep TE cooling unit 10 comprises a primary or central TE couple 12 assisted by at least three auxiliary couples 14, 16, 18. All the couples 12–18 within the unit 10 preferably have different sizes (i.e. different p-leg and n-leg lengths and cross sections). Representative parameters are shown in Table 1, where $L_I$ and $A_I$ represent the leg length and cross-section, respectively, of the central TE couple 12. It is understood that the TE couples 12, 14, 16 and 18 each include a p-leg and an n-leg connected at respective first ends 20 to form cold junctions, and are electrically connected at their respective second ends 22, also referred to herein as hot junctions, to produce Peltier cooling at the cold junctions 22.

TABLE 1

|  | CENTRAL TE COUPLE, I | FIRST AUXILIARY COUPLE, 1 | SECOND AUXILIARY COUPLE, 2 | THIRD AUXILIARY COUPLE, 3 |
| --- | --- | --- | --- | --- |
| $T_h$ (°K.) | 300 | 300 | 300 | 300 |
| $T_c$ (°K.) | 70 | 162 | 217 | 250 |
| $\Delta T°$ | 230 | 138 | 83 | 50 |
| Leg Length | $L_I$ | $3/5\ L_I$ | $9/25\ L_I$ | $27/125\ L_I$ |
| Cross Sectional Area of Leg | $A_I$ | $5/2\ A_I$ | $3/2\ A_I$ | $A_I$ |
| Total Resistivity ($\rho$ = Const) | $R_I\ (\Omega)$ | $6/25\ R_I$ | $6/25\ R_I$ | $27/125\ R_I$ |
| Total Thermal Conductivity | $K_I$ | $25/6\ K_I$ | $25/6\ K_I$ | $125/27\ K_I$ |
| Parallel Connection Current | $I_I$ | $25/6\ I_I$ | $25/6\ I_I$ | $125/27\ I_I$ |
| Thermal Load | Useful Load $Q_L$ | $1/2\ I_1^2\ R_I$ | $1/2\ I_1^2\ R_1$ | $1/2\ I_2^2\ R_2$ |
| Removed | $1/2\ I_I^2\ R_I$ | $1/2\ I_1^2\ R_1$ | $1/2\ I_2^2\ R_2$ | 0 |

The central TE cooling couple 12 is the deep cooler proper. It is assisted by a hierarchy of auxiliary couples which in the preferred embodiments shown will also be referred to as the first, second, and third auxiliary couples 14, 16 and 18. A minimum of three auxiliary couples is preferred, although it is possible to include more. All auxiliary couples in a deep TE cooler are thermally connected in parallel to the central TE couple. Preferably, the auxiliary couples further have decreasing lengths and decreasing cross-sectional areas from the first 14 to the third 18 auxiliary couple. Being connected thermally in parallel, rather than connected thermally in series, permits the auxiliary TE couples to be positioned in accordance with the present invention to absorb less than the whole Joule heat from the next preceding couple, as well as avoid the load from Peltier heating at the hot end thereof.

Still referring to FIG. 1, the cold junction 14c of the first auxiliary neighboring couple is thermally connected with (but electrically isolated from) the p- and n-legs, 12p and 12n respectively, of the central cooling couple 12 at a preferred distance of about 0.4 $L_I$ from its cold junction 12c, where $L_I$ is the length of the p- and n-legs 12p and 12n central couple. In like fashion, the cold junction 16c of the second auxiliary couple 16 is thermally connected with (but electrically isolated from) the legs 14p and 14n of the corresponding first auxiliary TE couple 14 at a distance of about 0.4 $L_{14}$ from its cold junction 14c, where $L_{14}$ is the length of the first auxiliary couple 14, and so on.

Because only one-half of the Joule heat generated in the body of the TE couple travels towards the cold junction (as shown by A. F. Ioffe in *Semiconductor Thermoelectrics and Thermoelectric Cooling*, Infosearch, London, 1957), concern may be focused upon removing only that half of the Joule heat. The distance of approximately 0.4 L is preferred as the representative point of extraction (or absorption) of the detrimental half of the evolved Joule heat, and eventually also partly the heat conduction, within the assisted TE couple. The approximately 0.4 L distance is a compromise between the mid-point of the legs (where the auxiliary couple should have to absorb the whole Joule heat, and a point shifted further into the direction of the cold junction (where the efficiency of heat absorption would have drastically decreased by the lower temperature difference between the point of extraction and the cold junction of the assisting TE couple). The point of extraction may vary in either direction depending on the application, so long as the cold junction of the assisting TE couple is colder than the point of extraction.

In the preferred, representative embodiments of the 70° K. compensated deep cooling units 10, all TE couples are single stage couples (i.e. cooled at their first ends 20 to temperature $T_c$ and having a temperature $T_h$ at their second ends 22 at ambient or slightly higher temperature due to Peltier heating thereat). In such a unit 10 it is essential to have a minimum of three auxiliary TE couples 14, 16 and 18 instead of, say, only one. Because the maximum temperature difference available for a single stage uncompensated TE couple with its second end 22 at ambient (300° K.) temperature is approximately 70° to 80° K., an uncompensated couple can develop a minimal temperature of not less than approximately 230°-240° K. (and even this without a thermal load). However, given an approximate straight line temperature profile of the central couple 12 from the desired design temperature of 70° K. at the cold junction to a point of extraction (approximately 0.4 $L_I$) where the first auxiliary couple 14 is to absorb heat, requires that the cold junction 14c of the auxiliary couple 14 should have a temperature of about 162° K. Should only one uncompensated auxiliary TE couple be used, this auxiliary TE couple can not be cold enough to be in a position to absorb heat from the central TE couple 12. In order to be able to absorb heat, primarily Joule heat, from the central couple 12, the first auxiliary couple 14 has to be "assisted" by a second auxiliary couple 16 in conditions similar to the assistance given to the central couple 12 from the first auxiliary couple 14. The temperature of the second auxiliary couple cold junction 16c should be approximately 217° K. The second auxiliary couple 16 for reasons similar to that brought above, has to be assisted by a third auxiliary couple 18. The temperature of the third auxiliary couple cold junction 18c should be approximately 250° K. Only the third auxiliary couple 18 is an uncompensated standard-type TE couple because it has to work with a temperature difference of about 50° K. (see Table 1). This is the basis for the preferred structure of a 70° K. deep TE cooling unit 10, and of the need for it to include at least three auxiliary couples.

The thermal loads absorbed from the next preceding TE couple ($Q_1$, $Q_2$, and $Q_3$) are summarized in Table 1. The central TE couple 12 is, thus, able to absorb a useful load $Q_L$.

Theoretically, the minimum temperature for deep cooling in accordance with the present invention may be said to be near liquid helium temperatures (4°–4.5° K.). However, because the Peltier coefficient is temperature dependent, and Peltier cooling decreases with temperature (the figure of merit, ZT, declines as the temperature approaches zero), there is a practical limit to thermoelectric deep cooling, even using assisted, thermally parallel structures disclosed in accordance with the present invention. Nonetheless, using conventional materials for the TE couples, and arranging three auxiliary TE couples in hierarchical order in accordance with the present invention, the minimum temperature for deep cooling is approximately 50°-60° K., without thermal load, and more particularly, about 56° K.

The geometry of the TE couples used in accordance with the present invention impacts both the Joule heat evolved therein, and the heat conduction from the second ends 22 to the cold junction. This is understood by referring to the expression for resistivity, R, which is related to Joule heating, and the expression for thermal conductivity, K, which is related to heat conduction. Resistivity may be expressed as:

$$R = \frac{L}{A} (\rho_p + \rho_n) \qquad \text{Eq. (2)}$$

where:
L is the length of the p- and n-legs;
A is the cross-sectional area of a leg; and
$\rho_p$ and $\rho_n$ are the effective specific resistivities of p- and n- legs, respectively, so that short legs and large leg cross-sectional area will reduce Joule heating. Thermal conductivity is given as:

$$K = \frac{A}{L} (K_p + K_n) \qquad \text{Eq. (3)}$$

where:
L is the length of the p- and n-legs
A is the cross-sectional area of a leg
$K_p$ and $K_n$ are the effective specific thermal conductivities of p- and n- legs, respectively, so that long legs and small cross-sectional area of a leg are desired to reduce thermal conduction.

The thermoelectric figure of merit, ZT, may be defined as:

$$ZT = \frac{(S_p + |S_n|)^2}{KR} T \qquad \text{Eq. (4)}$$

where:
Sp and $S_n$ are the effective Seebeck coefficients of the p- and n-legs, respectively
T is the temperature
K is the coefficient of thermal conductivity
R is the resistivity.

As understood from Eq. 4, the figure of merit, ZT, contains the product KR which does not depend upon the geometrical factor L/A or A/L which cancel (see Eqs. 2 and 3), and ZT behaves as a pure material characteristic. Nevertheless, in a compensated TE couple in accordance with the present invention, such as central TE couple 12, within the segment close to the cold junction, the Joule heat has been absorbed by auxiliary couples and the significance of resistivity in that segment of the TE couple has been attenuated. In that segment of the TE couple geometrical considerations may be used to further reduce thermal conductivity and resulting thermal conduction to the cold junction.

Figure 2:
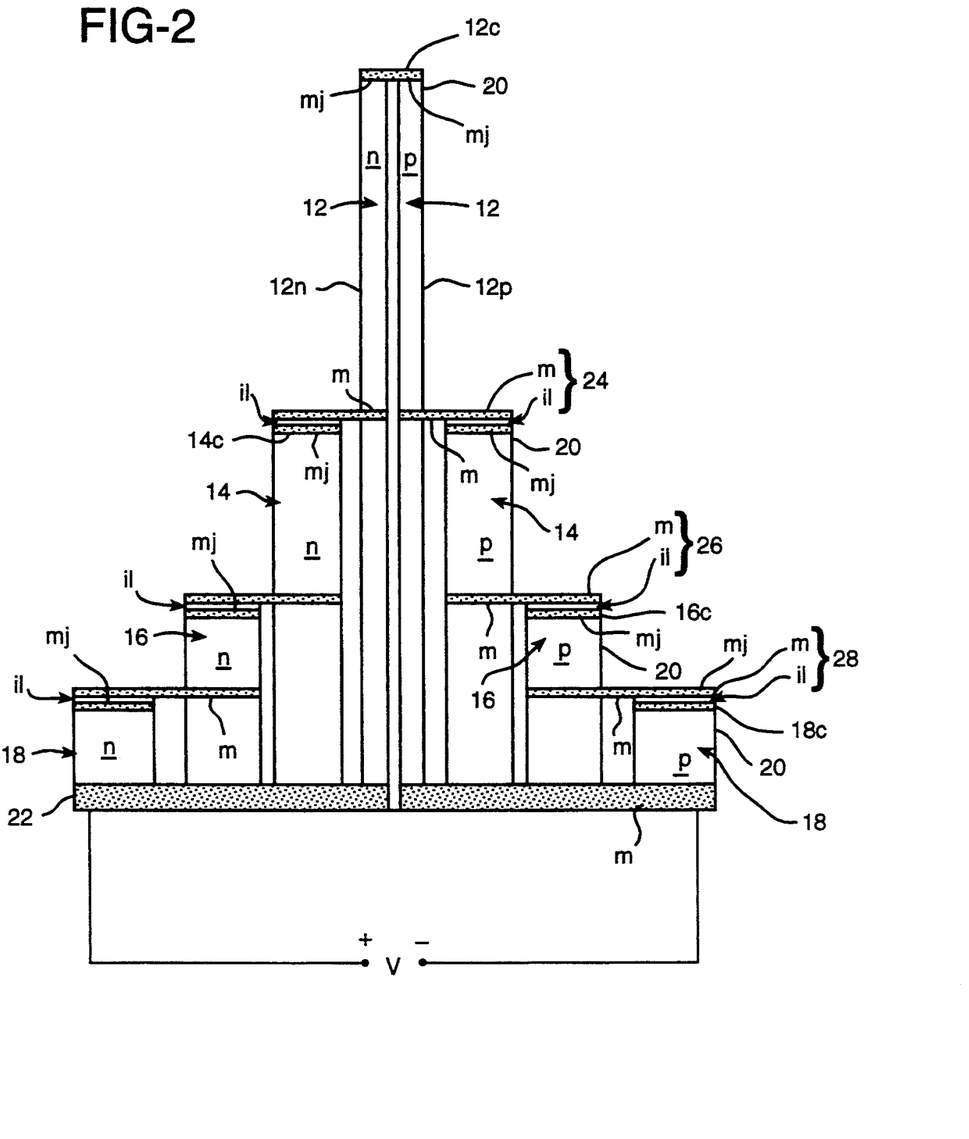
FIG. 2 is a schematic cross-sectional view of a compensated deep TE cooling unit in a cylindrical embodiment.
Figure 3:
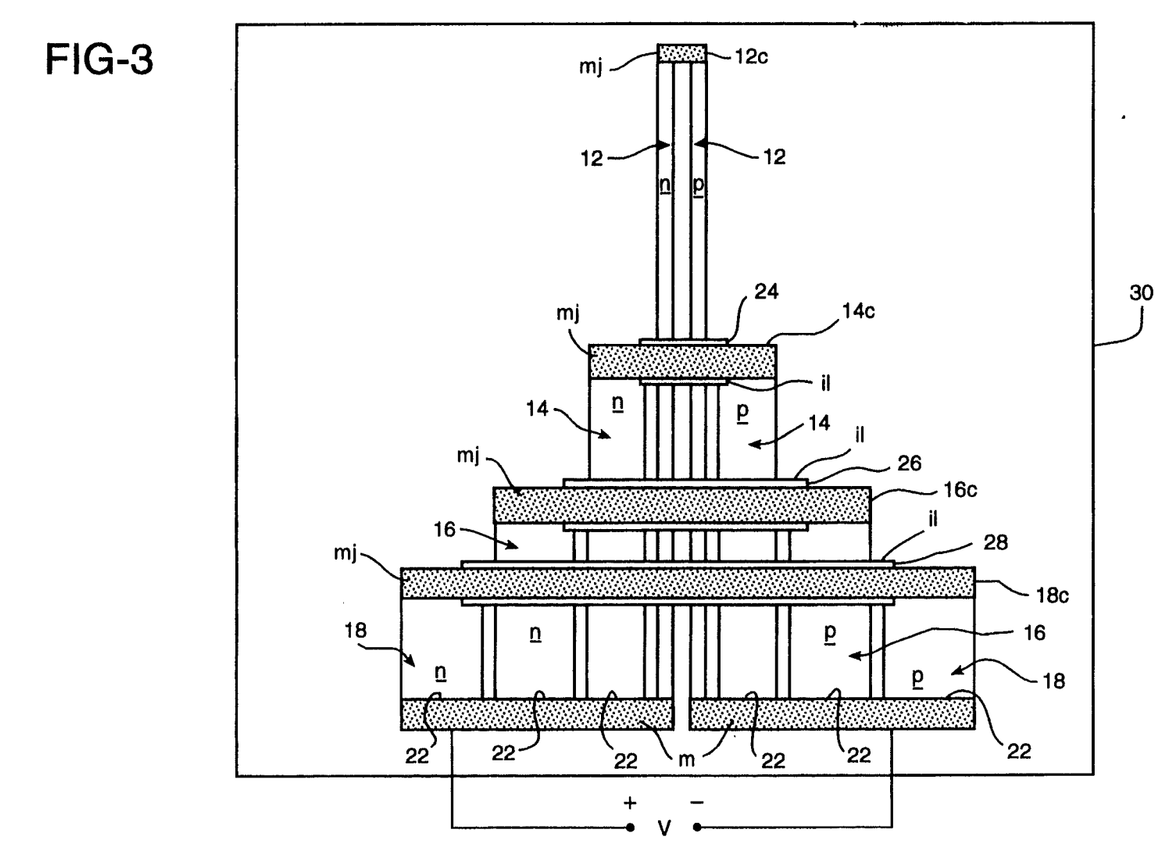
FIG. 3 is a schematic plan view of a compensated deep TE cooling unit manufactured in layers, for example, with the aid of thick layer technology.

In the preferred embodiments of FIGS. 1–3, if the length $L_I$ of the central TE couple 12 is taken as unity, the preferred lengths of the consecutive auxiliary couples 14, 16 and 18 are, respectively, $L_{14}=6$; $L_{16}=(0.6)^2=0.36$; $L_{18}=(0.6)^3=0.216$. The corresponding cross-sections of the auxiliary TE couples 14, 16 and 18 decrease, taking the cross-sectional area of the central couple $A_I$ as unity, as 2.5:1.5:1 (see Table 1). For any particular material, where the central TE couple has a resistivity $R_I$ and thermal conductivity of $K_I$, these preferred dimensions result in total resistivities and thermal conductivities as set forth in Table 1. In the above, uniform materials with uniform or effective resistivity, thermal conductivity, Seebeck coefficients, and cross-sections are assumed for simplicity. However, it is understood that the p- and n-legs may be non-uniform materials having, for example, variable dopings, the p- and n-legs may be different lengths and their cross-sections may be variable, and additional material characteristics such as resistivity, $\rho$, thermal conductivity K, and Seebeck coefficient S may be functions of temperature.

Thermal connection in parallel between the auxiliary TE couples and the next preceding TE couple is also shown in FIGS. 1-3. In all the Figures, good thermal connections between different TE couples belonging to the same deep cooling unit 10 maintain the TE couples electrically isolated one from the other. The material notations used within the FIGS. 1-3 indicate the various components of the thermal connectors 24, 26, 28. The thermal connectors 24, 26 and 28 each preferably include a metallic thermally conductive part, m, and an isolating electrical (glue) layer, il. The metallic parts, m, are preferably soldered or otherwise attached to the legs of the TE couples 12, 14, and 16, as shown. The isolating electrical layer, il, offers good thermal contact with the cold junction, while electrically isolating the metallic part m therefrom. Preferably, the isolating electrical layer comprises a thin layer or layers of special glues placed on the cold junction. The notation, mj, in the Figures indicates the soldered metallic junction bridging the p- and n-legs of a TE couple and serving as the cold junction. The differential thermal expansion between the metallic part m of the thermal connectors and metallic junction mj of the TE couples over the wide range of temperatures experienced make it desirable to use materials in the isolating electrical layer il which accommodate the different coefficients of expansion, and thereby avoid cracking and damaging the isolating electrical layer il. Preferably, adhesives or glues are chosen for isolating electrical layer il which are sufficiently elastic at low temperatures to accommodate the differential thermal expansion. The materials of m, mj and il are known in the art, and the connections are made with methods known in the art.

In operation of the preferred embodiments, the central and auxiliary TE couples 12 and 14, 16, 18 are preferably electrically connected in parallel to the same common dc voltage V. The currents passing through the auxiliary couples are more than quadrupled in comparison with the central couple, where the auxiliary cooling hierarchies comprise a single TE couple (see Table 1). It is reasonable to split each of the first, second, and third auxiliary couples 14, 16 and 18 into four separate couples, all with a unique cross section 1.2 $A_j$, and to electrically connect them in series (not shown) with the central couple 12 to reduce the current demand (while increasing the voltage requirement). Another possible solution, which is preferred, is a combined parallel and series connection where the auxiliary TE couples are split into four serially connected TE couples which are electrically connected in parallel to the central TE couple. In like fashion, it is also possible to split the central TE couple 12 into several separate TE couples, as may be desirable in certain applications. Again, such splitting of the central and auxiliary TE couples 12 and 14, 16, 18 can be accomplished for manufacturing uniformity, or to accommodate electrical connections which produce desirable electrical operating demands. It is understood that various combinations of split TE couples and electrical connections are possible in this regard. Because each TE couple in the deep cooling unit 10 can be comprised of a plurality of separate or split TE couples (see FIG. 4), the central TE couples 12 may also be referred to generally as the primary cooling hierarchy, and the auxiliary couples may also be referred to as auxiliary cooling hierarchies.

Alternative structural arrangements shown in FIGS. 2 and 3 achieve deep cooling in accordance with the present invention with single stage TE couples, as well, and illustrate that the overall structure of the present invention may be modified for use of advantageous manufacturing techniques, for compactness, or for other reasons. As well, improved support and protection of the outwardly extending first end 20 of the central TE couple 12 is achieved in the alternative arrangements. In FIG. 2, additional mechanical support is provided around the central TE couple, while in FIG. 3 the substrate provides additional mechanical support to not only the first end 20 but the entire deep cooling unit 10.

FIG. 2 shows a thermoelectric deep cooling unit 10 in accordance with the present invention in which the auxiliary TE couples 14, 16, 18 are positioned or arranged in generally concentric relationship around the central TE couple 12. In this arrangement, the cold junctions 14c, 16c, and 18c, are ring-shaped, while the thermal connectors 24, 26 and 28 are half-rings. The overall structure of FIG. 2 is compact, efficient, and provides additional support for the central TE couple 12, which makes it the best mode for individual units 10 illustrated by FIGS. 1 and 2.

Figure 4:
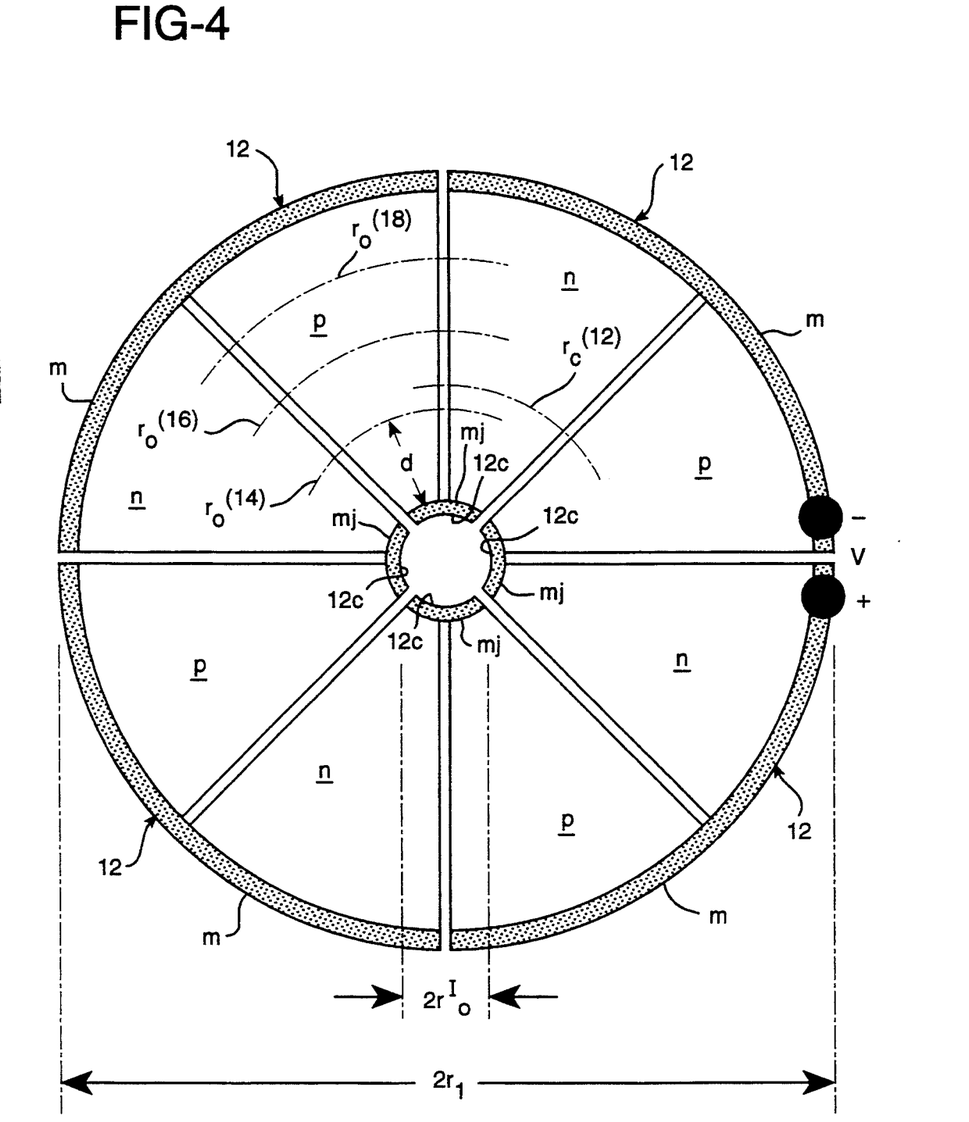
FIG. 4 is a schematic plan view of a representative disc for a TE cooling unit preferably manufactured in layers.

FIG. 3 further shows a compensated TE deep cooling unit 10 in accordance with the present invention which is manufactured in layers with the aid of thick layer technology. This embodiment illustrates the use of current thick layer technology, and the potential for other high volume semiconductor manufacturing techniques to produce the present invention with known materials. The order in which the layers may be laid on a substrate (30) may be, by way of example not limitation: applying first and second layers comprising the n- and p-legs of all TE couples; applying a third layer comprising the electrically isolating glue layer, il; applying a fourth layer comprising the metallic junction, mj; and applying a fifth layer comprising a metallic part, m, (if different from the material of the fourth layer), which provides electrical connection in parallel at the second ends 22. In the structure of FIG. 3, thermal connections 24, 26 and 28 need to comprise only an insulating layer il which is positioned between the cold junctions of the auxiliary TE couples, and the p- and n-legs of the next preceding TE couple. While deposition techniques using conventional thermoelectric materials require further refinement for commercial viability, deposition and thick layer techniques, as well as painting, or other known techniques developed for semi-conductor production may be used to produce the structure of FIG. 3.

Where a substrate is used to support the TE cooling unit, as in FIGS. 3 and 4, it is necessary to consider the thermal expansion of both the TE couples and substrate over the wide range of temperatures experienced to avoid introducing cracks and strains in the TE couples during thermal cycling. The substrate may be chosen with a coefficient of thermal expansion matching that of the TE couples, or the TE couples attached to the substrate with adhesives or glues which are elastic to accommodate differential thermal expansion.

The geometries of FIGS. 1-3 are representative of the devices which may be produced in accordance with the present invention, and other geometries, such as discs, squares, triangles, and the like, are possible. The disc-like embodiment of FIG. 4 is representative of other geometries which may be used in accordance with the present invention. FIG. 4 shows a plan view of one disc of a, preferably, four disc, deep cooling TE unit 10. All four discs have the same outer radius $r_I$, but different inner radiuses, $r_o$. That is, as indicated in phantom, $r_o$ in the four disc embodiment varies as $r_o^I < r_o^{(14)} < r_o^{(16)} < r_o^{(18)}$, where $r_o^I$ is the inner radius of the central TE couple 12, and $r_o^{(14)}$, $r_o^{(16)}$ and $r_o^{(18)}$ are the inner radiuses of the auxiliary TE couples 14, 16 and 18, respectively. In the example shown in FIG. 4, for each disc the outer radius $r_I$ is the hot junction, and the inner radius $r_o$ is the cold junction. Depending on the application, these could be reversed, i.e. with the cold junction at the outer radius $r_I$.

The discs are superimposed one upon the other in accordance with the number of their hierarchy, i.e. the first auxiliary TE couple 14 is imposed upon the central TE couple 12, the second auxiliary TE couple 16 imposed upon the first, and so on. The discs are electrically and thermally isolated one from the other by intervening layers of material (not shown), and are thermally connected with the p- and n-legs of next preceding hierarchy only through their metallic junctions mj located at their respective inner radiuses $r_o$. A disc-shaped deep cooling TE unit 10 made in accordance with FIG. 4 is preferably made on a substrate, in the same manner as the unit of FIG. 3, but is not limited to such a method. The thickness of the discs preferably increases in the auxiliary TE couples 14, 16 and 18 as their inner radiuses increase, as in the previous embodiments.

The distinctive characteristic of the disc-like embodiment of FIG. 4 consists in the variable cross-sectional areas of the p- and n-legs of the TE couples, which are pie-shaped arcuate segments. Each disc is preferably composed of an even number of segments, illustratively shown as eight segments, although the number may vary and is not limited to the example shown. The segments in each disc are joined in pairs by the metallic junctions mj along inner radius $r_o$ to form the cold junctions of TE couples. The TE couples forming a disc are electrically connected in series (as in the preferred embodiments of FIGS. 1 and 3 where split TE couples are provided) by metallic parts m at the hot junctions along outer radius $r_I$. The discs of each hierarchy are, in turn, electrically connected in parallel to a common dc current source. It is preferred, but not required, that the same number of segments be present in each hierarchy of a deep cooling TE unit 10 in accordance with FIG. 4.

The electrically isolated thermal connection between the cold junction of an auxiliary TE couple and the p- and n-legs of the next preceding (assisted) TE couple, is made along a circle which is positioned towards the cold junction where it intercepts the detrimental half of the Joule heat which flows towards the cold junction. The area of the segments at which the joule heat is a maximum, and at which Joule heat flux is zero (half flowing to the cold junction and half to the hot junction), defines a circle around the disc. The radius $r_c$ of this circle of zero heat flux is given by the expression:

$$r_c = (r_o r_I)^{\frac{1}{2}} \qquad \text{Eq. (5)}$$

where:

$r_o$, $r_I$ and $r_c$ are the inner, outer and critical radiuses, respectively, for the same disc The thermal connection between the cold junction of an auxiliary TE couple and the legs of the next preceding TE couple is positioned towards the cold junction of the next preceding TE couple from this circle of zero heat flux (and maximum Joule heat). The exact position of the TE couple towards the cold junction is not amenable to definition as a unique point, or more generally quantifiable in relation to some mid-point (as in the embodiments of FIGS. 1-3) because the geometry and cross-section of the segments may vary from one unit 10 to the next, causing the radial heat gradients in the segments of those units 10 to differ. In general, it may be said that the radial heat gradient changes more quickly closer to the cold junction, and more slowly towards the hot junction. It follows that the accuracy with which the cold junctions of the first auxiliary TE couples 14 are positioned on the legs of the central TE couples 12 is more important than the positions of TE couples in subsequent auxiliary cooling hierarchies.

The position, d, of thermal connection between the cold junctions at the inner radius of an auxiliary TE couple of an auxiliary cooling hierarchy (i.e. assisting disc), and the inner radius of the TE couples of the next preceding hierarchy (i.e. the assisted TE disc), can be determined by the relationship:

$$d < \frac{r_1 - r_o}{(r_1/r_o)^{\frac{1}{2}} + 1} \qquad \text{Eq. (6)}$$

where:

d and $r_I$ relate to dimensions of the assisting disc of the auxiliary cooling hierarchy, and $r_o$ belongs to the assisted disc.

By way of example and not limitation, Table 2 summarizes the dimensions of an illustrative deep cooling TE unit 10 made in accordance with FIG. 4. For convenience, $r_o^I = 3$ millimeters (mm) and $r_I = 27$ mm.

TABLE 2

| Hierarchy No. | I | 1 | 2 | 3 |
|---|---|---|---|---|
| Element No. in Figures | 12 | 14 | 16 | 18 |
| $r_1$ (mm) | 27 | 27 | 27 | 27 |
| $r_0$ (mm) | 3 | 8 | 13 | 17 |

Again, because the radial temperature gradient in a disc-like embodiment is non-linear, the position of the zero joule heat flux circle depends essentially upon the $r_1/r_o$ ratio. Other than this, the disc-like embodiment does not differ substantially from the more linear embodiments of FIGS. 1-3.

To increase overall heat pumping capability, in accordance with the present invention a plurality of thermoelectric deep cooling units 10 can be applied together to form a compensated deep thermoelectric cooling module by thermally connecting the cold junctions 12c of the central TE couple, i.e. the deep cooler, to a plate or other element to which a thermal load can then be applied. For such a module, the structure of FIG. 3 is generally preferred. For certain applications, such as infra-red goggles, the structure of FIG. 4 is preferred.

The above description of a compensated deep TE cooling unit 10 applies essentially to compensated devices removing half of the Joule heat only. Devices which, in addition to the ½ of Joule heat, also remove a portion of the heat conducted towards the cold junction, are structurally similar but deliver additional compensatory cooling to a point or points of extraction. The result of providing additional compensatory cooling to remove some thermal conduction from the second end 22 to the first end 20 causes the cooling to be somewhat deepened at the cold junction. Additional compensatory cooling can be accomplished by a further increase in the cross-sections of the auxiliary couples to increase the cooling capacity, or by an increase of the total number of TE couples within each hierarchy of auxiliary TE couples. However, it is preferred to limit thermal conduction by geometry, and use the auxiliary TE couples to remove Joule heat only.

While the above discussion is directed towards deep cooling, the present invention is equally applicable to produce cooling short of deep cooling using the principle of thermally connecting TE couples in parallel. To achieve lesser levels of cooling a lesser number, e.g. one or two, auxiliary cooling hierarchies may be applied to the central cooling hierarchy. The point of connection will differ depending on the application and level of cooling desired. However, the present invention makes possible the use of single stage TE couples to achieve levels of cooling with higher COPs and lower operating costs, as only Joule heat is extracted along with some small part of conductive heat. The Peltier heating at the hot junctions, removed by multi-stage devices, is thereby avoided.

By way of example, but not limitation, to provide a moderate TE cooling unit with one auxiliary TE couple 14 (or one auxiliary cooling hierarchy including a plurality of couples) connected thermally in parallel with a central TE couple 12, the point of extraction is approximately $0.5 \, L_I$. In this example, the auxiliary TE couple 14 removes approximately the entire Joule heat ($I^2R$) from the central couple, along with some small part of the thermal conduction in the central TE couple 12. Such a device could be a straightforward version of any embodiment of FIGS. 1–4. In this example, the cold junction 12c of the central couple 12 would have a temperature $T_c = 178°$ K. providing a $\Delta T = 122°$ K. from ambient temperature. The cold junction 14c of the auxiliary TE couple 14 would have a temperature $T_c = 239°$ K., providing a $\Delta T = 61°$ K. from ambient temperature. The ratio of cross-sectional areas of the central and auxiliary TE couples 12 and 14, taking the cross-sectional area of the central couple $A_I$ as unity, will be approximately 1:3.

It is understood that vacuum and thermal isolation of the TE cooling units, particularly deep cooling units 10, is necessary to prevent external heat input and allow the units 10 to achieve the operating temperatures made possible in accordance with the present invention. Such vacuum and thermal isolation is known in the art and is used, for example, in constructing devices for infra-red sensors (e.g. silvered dewars having evacuated internal spaces in which sensors are mounted). Other vacuum and thermal isolation means are known in the art and discussed in the literature, such as super thermal isolator sheets, which may be used to reflect heat.

In view of the present invention, conventional thermoelectric materials having figures of merit, ZT, of approximately 0.7 or more may now be used to produce deep cooling. By way of example, not limitation, suitable conventional materials useful in the TE couples in accordance with the present invention may be $Bi_2Te_3$-based alloys with antimony and selenium, for example, $Bi_{2-x}Sb_xTe_{3-y}Se_y$, with different doping as known in the art, as well as $Bi_{1-x}Sb_x$ alloys, with appropriate doping known in the art. As is known in the art, $Bi_{1-x}Sb_x$ alloys are known with superior doping for n-legs, but with less effective doping for p-legs. However, as various alternative solutions for p-leg materials are discussed in the literature, such alloys are representative of possible materials for a TE cooling unit.

It should be emphasized that the preferred architecture of the compensated TE deep cooling unit 10 of the present invention has nothing in common with the well-known multi-stage arrangement of ordinary, standard TE coolers. First, in ordinary multi-stage TE coolers, the module-stages are thermally connected in series, whereas the TE couples within a compensated cooler in accordance with the present invention, which belong to two neighboring hierarchies, are thermally connected in parallel. A second difference is that in conventional multi-stage arrangements, every stage has to absorb the whole heat produced by the upper stage (i.e. both ½ the Joule heat going to the second end, given by the term, $\frac{1}{2}I^2R$, plus the whole Peltier heat at the second ends [hot junctions]); whereas in the compensated thermoelectric deep cooler in accordance with the present invention, a given auxiliary couple absorbs (in the case of a device removing the ½ of the Joule heat only) not more than one third of the heat produced within the assisted neighboring pair (i.e. ½ of the Joule heat which goes to the cold junction versus the other ½ of the Joule heat which goes to the second end plus the whole Peltier heat at the second ends [hot junction]).

It is further understood, however, that multi-stage thermoelectric couples could be used as one of the TE couples being assisted, or assisting a hierarchical neighboring couple in accordance with the present invention. However, any combination of the present invention with multi-stage devices will worsen energy demand, and reduce the overall COP. Conventional multi-stage TE couples are inefficient coolers and, as a result, are expensive to operate. Thus, it is preferred to use single stage TE couples in accordance with the present invention.

While certain representative embodiments and details have been shown for purposes of illustrating the present invention, it will be apparent to those skilled in the art that various changes in the apparatuses and methods disclosed herein may be made without departing from the scope of the invention, which is defined in the appended claims.

What is claimed is:

1. A compensated thermoelectric cooling unit comprising a plurality of thermally parallel cooling hierarchies each including at least one thermoelectric couple, said unit having a primary cooling hierarchy and at least one auxiliary cooling hierarchy thermally connected in parallel therewith;

each said thermoelectric couple including a p-leg and an n-leg connected at respective first ends to form respective cold junctions, and electrically connected at respective second ends to produce Peltier cooling at the cold junctions and to produce Joule heating between the first and second ends;

each said auxiliary cooling hierarchy having at least one thermal connector thermally connecting at least one respective cold junction of an auxiliary cooling hierarchy to at least one leg of at least one thermoelectric couple of the immediately preceding cooling hierarchy, said thermal connector thermally connecting to said at least one leg at a discrete position intermediate between the first and second ends thereof, and located where Joule heat traveling towards said first end may be substantially removed through said thermal connector only;

at least one said auxiliary cooling hierarchy having p-legs and n-legs sized to substantially remove Joule heat which is traveling towards said first ends of the immediately preceding cooling hierarchy;

whereby the auxiliary cooling hierarchies are thermally connected in parallel and remove a portion of at least the Joule heat from said primary thermoelectric couple for thermoelectric cooling thereof.

2. The cooling unit of claim 1 wherein at least one of said plurality of thermoelectric couples is a single hierarchy thermoelectric couple.

3. The cooling unit of claim 1 wherein said position at which said thermal connector thermally connects to said at least one leg is between the cold junction and generally midway between the first and second ends of said at least one leg thereof.

4. The cooling unit of claim 3 wherein said position is spaced from the cold junction approximately four-tenths of the distance between the first and second ends.

5. The cooling unit of claim 1 wherein said position at which said thermal connector thermally connects to said at least one leg is between the cold junction and an area between the first and second ends of said at least one leg where Joule heat flux is substantially zero during operation of said cooling unit.

6. The cooling unit of claim 1 wherein at least one said cooling hierarchy includes a plurality of thermoelectric couples thermally interconnected at their respective cold junctions by a common thermal connector.

7. The cooling unit of claim 1 wherein said thermal connector comprises a thermally conductive part extending from said at least one cold junction to intersect said at least one leg of a thermoelectric couple of an immediately preceding cooling hierarchy, said thermal connector electrically isolating said at least one leg of a thermoelectric couple from said at least one cold junction.

8. The cooling unit of claim 1 wherein the thermoelectric couples in the primary cooling hierarchy and succeeding auxiliary cooling hierarchies decrease in leg length from longer legs in the primary cooling hierarchy to shorter legs in the succeeding auxiliary cooling hierarchies.

9. The cooling unit of claim 1 wherein said unit includes said primary cooling hierarchy and at least first, second, and third auxiliary cooling hierarchies connected in hierarchical order one to the next in thermally parallel relationship.

10. The cooling unit of claim 9 wherein:
said thermoelectric couples are all single hierarchy couples;
said at least one thermal connector thermally connects both legs of the at least one thermoelectric couple of the immediately preceding cooling hierarchy; and
said position at which said thermal connector thermally connects to said legs is between the cold junction and generally midway between the first and second ends of said at least one leg thereof.

11. The cooling unit of claim 1 wherein said auxiliary cooling hierarchies are positioned in generally concentric relationship around said primary cooling hierarchy.

12. The cooling unit of claim 1 wherein said unit is comprised of layers of material deposited on a substrate.

13. The cooling unit of claim 12 Wherein at least a portion of a plurality of said layers are deposited in stacked relationship.

14. The cooling unit of claim 1 wherein said primary cooling hierarchy is cooled at its cold junction to a temperature less than 130 degrees Kelvin.

15. The cooling unit of claim 1 wherein said primary cooling hierarchy is cooled at its cold junction to a temperature less than 100 degrees Kelvin.

16. The cooling unit of claim 1 wherein said primary cooling hierarchy is cooled at its cold junction to a temperature less than 70 degrees Kelvin.

17. The cooling unit of claim 1 wherein said primary cooling hierarchy is cooled at its cold junction to a temperature of approximately 56 degrees Kelvin.

18. A compensated thermoelectric module comprising:

a plurality of compensated thermoelectric cooling units, each said unit comprising:
a plurality of thermally parallel cooling hierarchies each having at least one thermoelectric couple, wherein said plurality of cooling hierarchies includes a primary cooling hierarchy and at least one auxiliary cooling hierarchy thermally connected in parallel therewith;
each said thermoelectric couple including a p-leg and an n-leg connected at respective first ends to form respective cold junctions, and electrically connected at respective second ends to produce Peltier cooling at the cold junctions and to produce Joule heating between the first and second ends;
each said auxiliary cooling hierarchy having at least one thermal connector thermally connecting at least one respective cold junction of an auxiliary cooling hierarchy to at least one leg of at least one thermoelectric couple of the immediately preceding cooling hierarchy, said thermal connector thermally connecting to said at least one leg at a discrete position intermediate between the first and second ends thereof, and located where Joule heat traveling towards said first end may be substantially removed through said thermal connector only;
at least one said auxiliary cooling hierarchy having p-legs and n-legs sized to substantially remove Joule heat which is traveling towards said first ends of the immediately preceding cooling hierarchy; and
said plurality of compensated thermoelectric cooling units arranged such that the cold junctions of their respective primary cooling hierarchies cool a common element.

19. A method for cooling a thermoelectric unit comprising the steps of:
providing a plurality of thermoelectric couples each including a p-leg and an n-leg connected at their respective first ends to form respective cold junctions, and electrically connected at their respective second ends to produce Peltier cooling at the cold junctions and Joule heating between the first and second ends;

arranging groups of one or more of said thermoelectric couples into a primary cooling hierarchy and at least one auxiliary cooling hierarchy, said step of arranging including:

sizing said thermoelectric couples in said at least one auxiliary cooling hierarchy to substantially remove Joule heat which travels toward said first ends; and thermally connecting at least one auxiliary cooling hierarchy generally at its cold junction in parallel with said primary cooling hierarchy at a discrete position between said first and second ends of said primary cooling hierarchy for substantial removal of Joule heat traveling towards said first ends; and operating said thermoelectric couples to produce Peltier cooling at their respective cold junctions and substantially removing with at least one auxiliary cooling hierarchy that portion of Joule heat from the primary hierarchy which otherwise travels toward the cold junction thereof, thereby increasing cooling at the cold junction of the primary cooling hierarchy.

20. The method of claim 19 wherein:

said step of providing comprises providing at least three thermoelectric couples;

said step of arranging includes arranging said thermoelectric couples into a primary cooling hierarchy and a plurality of auxiliary cooling hierarchies; and said step of thermally connecting includes thermally connecting subsequent ones of said auxiliary cooling hierarchies, generally at their cold junctions, in parallel with the immediately preceding auxiliary cooling hierarchy at a point of connection between respective first and second ends of the immediately preceding auxiliary cooling hierarchy, for substantial removal of Joule heat travelling towards the first end of the immediately preceding auxiliary cooling hierarchy.

21. The method of claim 19 wherein said step of thermally connecting in parallel comprises the steps of:

providing a thermally conductive part;

thermally connecting one portion of said thermally conductive part to at least one cold junction of an auxiliary cooling hierarchy, and further connecting another portion of said thermally conductive part to at least one leg of a thermoelectric couple of the immediately preceding cooling hierarchy, whereby the step of thermally connecting connects cooling hierarchies in parallel and removes a portion of at least the Joule heat from said primary thermoelectric couple for deep thermoelectric cooling thereof.

22. The method of claim 21 wherein:

said step of thermally connecting to at least one cold junction includes the step of electrically isolating said thermally conductive part from said at least one cold junction; and said step of further connecting includes penetrating at least a portion of said at least one leg of a thermoelectric couple of the immediately preceding cooling hierarchy with said thermally conductive part.

23. The method of claim 21 wherein said step of further connecting to at least one leg includes thermally connecting both legs of the thermoelectric couple to at least one cold junction of an auxiliary cooling hierarchy.

24. The method of claim 21 wherein said step of further connecting to at least one leg includes positioning said further connection between the first and second ends of said at least one leg.

25. The method of claim 24 wherein the step of positioning comprises positioning said further connection generally at a single position between approximately midway between the first and second ends of said at least one leg, and the cold junction.

26. The method of claim 24 wherein the step of positioning comprises positioning said further connection generally at a single position between the cold junction and an area between the first and second ends of said at least one leg where Joule heat flux is substantially zero during operation of said cooling unit.

27. The method of claim 24 wherein said step of thermally connecting comprises positioning said further connection generally at a single position spaced from the cold junction of said at least one leg at which, when so connected, has a temperature equal to or greater than the temperature of the auxiliary cooling hierarchy cold junction connected thereto.

28. The method claim 19 wherein the steps of providing, arranging, and thermally connecting are performed with layers of materials on a substrate.

29. The method claim 19 wherein the steps of providing, arranging, and thermally connecting further include:

providing an additional one or more of said thermoelectric couples;

arranging groups of one or more of said additional thermoelectric couples into at least one additional cooling hierarchy; and thermally connecting said at least one additional cooling hierarchy in parallel to at least one thermoelectric couple in said primary cooling hierarchy, said step of thermally connecting including the steps of:

positioning said additional cooling hierarchy to intercept heat conducted down one or more of said legs from respective second ends towards said cold junction; and removing thereby at least a portion of the heat conducted from at least one second end towards said cold junction.

30. The method of claim 19 wherein:

the step of providing includes providing at least four thermoelectric couples;

the step of arranging includes arranging said at least four thermoelectric couples into a primary cooling hierarchy and at least first, second and third auxiliary cooling hierarchies; and said step of thermally connecting includes thermally connecting the cooling hierarchies in hierarchical order, one to the next; and said step of operating produces cooling at the cold junction of the primary cooling hierarchy to temperatures below 100 degrees Kelvin.

31. The method of claim 19 wherein the step of operating includes the step of producing cooling down to at least 130 degrees Kelvin.

32. The method of claim 19 wherein the step of operating includes the step of producing cooling down to at least 100 degrees Kelvin.

33. The method of claim 19 wherein the step of operating includes the step of producing cooling down to at least 70 degrees Kelvin.

34. The method of claim 19 wherein the step of operating includes the step of producing cooling down to a temperature of approximately 56 degrees Kelvin.

35. The method of claim 19 further comprising the steps of;

repeating the steps of providing, arranging, thermally connecting, and operating for a plurality of cooling thermoelectric units; and combining said plurality of thermoelectric units into a compensated thermoelectric module.

36. The method of claim 19 wherein said step of thermally connecting includes penetrating at least one leg of a thermoelectric couple in said primary cooling hierarchy.

* * * * *